United States Patent [19]

Lukoff

[11] Patent Number: 5,426,602

[45] Date of Patent: Jun. 20, 1995

[54] DETECTION OF MULTIPLE HITS WITHIN A DEVICE HAVING MULTIPLE SENSE OUTPUTS

[75] Inventor: Arthur G. Lukoff, Hillsboro, N.J.

[73] Assignee: Mentor Graphics Corporation, Wilsonville, Oreg.

[21] Appl. No.: 40,867

[22] Filed: Mar. 31, 1993

[51] Int. Cl.⁶ ............... G11C 15/00; H01L 27/10
[52] U.S. Cl. .................... 365/49; 365/196; 365/201; 365/72; 326/36; 326/106
[58] Field of Search ............ 365/49, 196, 201, 72; 307/449, 463, 464

[56] References Cited

U.S. PATENT DOCUMENTS

| | | |
|---|---|---|
| 4,785,398 | 11/1988 | Joyce et al. . |
| 4,813,002 | 3/1989 | Joyce et al. . |
| 4,965,767 | 10/1990 | Kinoshita et al. ............ 365/49 |
| 5,040,134 | 8/1991 | Park ............ 364/602 |
| 5,107,122 | 4/1992 | Barkan et al. . |
| 5,173,872 | 12/1992 | Crawford et al. . |
| 5,327,372 | 7/1994 | Oka et al. ............ 365/189.02 |

FOREIGN PATENT DOCUMENTS 62-267999 11/1987 Japan .

Primary Examiner—Viet Q. Nguyen
Attorney, Agent, or Firm—Klarquist Sparkman; Campbell Leigh & Whinston

[57] ABSTRACT

A hit detector for detecting and distinguishing between single and multiple hits within a device having multiple sense outputs, such as content-addressable memory (CAM). For a 64-word CAM, the hit detector has three stages. The first stage is a set of two matrices of individual detectors connected to sense lines of the CAM for detecting single or multiple hits indicated by one or more sense lines. The second stage is a set of four matrices, two each connected to the outputs of a matrix of the first stage for resolving the outputs of the first stage. The third stage is combinational logic for resolving the outputs from the second stage. The matrices of the first stage are groups of individual detectors divided into subgroups, with each detector within a subgroup associated with a separate sense line of the CAM. All detectors within a subgroup share a common detect line that indicates a hit if one or more detectors within the subgroup detects a hit from an associated sense line. The sense lines are associated with the two matrices in different order so that no subgroup of the first matrix has more than one sense line in common with a subgroup of the second matrix. This ordering ensures that a multiple hit causes more than one detect line in at least one of the matrices to indicate a hit.

20 Claims, 5 Drawing Sheets

DETECTION OF MULTIPLE HITS WITHIN A DEVICE HAVING MULTIPLE SENSE OUTPUTS

FIELD OF THE INVENTION

This invention relates generally to devices with multiple sense outputs such as content-addressable memories (CAMs) and detection arrays. More particularly, this invention relates to detecting and distinguishing among zero, one, or multiple hits within such a device.

BACKGROUND OF THE INVENTION

Modern computers use virtual memory to make the quantity of memory available for computation appear much greater than the actual physical memory within the computer. The physical memory, also known as main memory, is typically high-speed random access memory (RAM) in which currently active computer programs reside. Virtual memory is a memory management technique that allows all memory, including the physical memory and mass storage devices such as hard disks, to be addressed as one large address space. To permit this, the total memory is divided into blocks of data know as "pages" that are typically 512 or 1024 data words long, each word usually being one or more 8-bit bytes in length. The physical memory, because of its limited size, holds only a number of pages, with the rest of the pages being stored on the mass storage device. When the computer needs a data word, it generates a virtual address that contains a page number and a word number. The page number indicates which page of the virtual memory contains the desired data word, and the word number is the address of the word within the page. If a desired page resides in the physical memory, then the data word is immediately available. If a desired page does not, then the page containing the desired data is moved from the mass storage device into the physical memory. The process of moving pages between physical memory and mass storage is called "swapping" or "paging" and results in the replacement of a page in physical memory with a page from the mass storage device.

To determine whether a page resides in main memory, a device such as a translation-lookaside buffer (TLB) is used. The TLB contains a list of the pages currently in physical memory and their physical memory addresses. The TLB has two functions: to determine if a desired page is present in physical memory, and, if so, to translate the page's virtual address into a physical memory address. If the TLB determines the desired page is not present in the physical memory, then it signals that the page must be retrieved from the mass storage device.

TLBs may be designed in a number of ways, including with content-addressable memories (CAMs). A CAM is a memory device similar to a RAM, but with the ability to compare an incoming data word simultaneously to data stored at each address within the CAM and signal which address(es) match the incoming word. This is accomplished by placing a comparator in each memory location, or cell, within the CAM. The comparator compares the contents of its cell to a bit of the incoming data word. All comparator outputs along a CAM word are combined to form a sense line output. During a compare operation, a sense line stays active only if all cells along the word match the incoming data word, indicating a "hit." If any cells do not match, the sense line is forced inactive.

In a TLB, the CAM is typically paired with a RAM, with page numbers stored in the CAM and associated physical memory addresses stored in the RAM, An address translation consists of a compare operation in the CAM followed by a read cycle in the RAM. During the address translation, the incoming data word to the CAM is a page number that is simultaneously checked against all page numbers in the CAM. If a match is found, then the associated address in RAM is used as the physical page address, and the CAM signals a "hit" to the computer. The physical page address is then combined with the word number to provide the complete physical memory address for the data word. However, if no match is made, the CAM signals a "miss" and the computer responds by retrieving the page from mass storage.

Occasionally, a CAM will signal multiple hits, indicating the data word is at multiple locations in main memory. Multiple hits indicate an error, since the computer cannot determine which of the multiple hits is correct. If this error goes undetected, the computer may execute an incorrect instruction or use incorrect data, causing the final results to be in error or the program to abort. Sometimes this condition can be detected and the computer restarted, but many times it remains undetected. Consequently, techniques have been developed for detecting and differentiating between zero, one or multiple hits. If multiple hits are detected, the computer will be halted until appropriate steps are taken to minimize the damage.

One conventional approach for detecting multiple hits within a CAM is with multiple stages of digital combinational logic. The sense line outputs are divided into a number of small groups and each group is applied to a cell of logic gates that provide two outputs: a first signal that indicates one or more hits within the group, and a second signal that indicates multiple hits within that group. The first and second signals from all the cells are then applied to a second stage of similar cells, which reduces the number of signals while combining their collective information. This process continues until the last stage, a single cell, produces two output signals that indicate zero, one or multiple hits for the entire CAM. While accurate, this approach is inherently slow because of the delay inherent in the signals propagating through the vast amount of logic in the digital network.

A second conventional approach is analog in nature, with a faster speed of operation than the digital approach. It requires a detect line whose voltage falls at a rate proportional to the number of hits and a reference detect line whose voltage falls at a reference rate each time a compare occurs within the CAM. The voltage levels of the two detect lines are compared in an analog sense amplifier. If a single hit occurs, the voltage on the reference detect line falls at a faster rate than the voltage on the detect line and the sense amplifier does not signal a multiple hit. However, if multiple hits occur, the voltage on the detect line falls at a faster rate than the voltage on the reference detect line and the sense amplifier signals multiple hits. There are, however, several disadvantages of this approach. There is a risk associated with getting the timing correct on several critical signals to ensure that the detect lines are at the correct state when the sense amp is triggered. Also, the sense amplifier must have a sufficient voltage differential (including noise) on the inputs to operate correctly. Designs using this approach may need to be re-engineered to improve the timing or voltage differential, based on the results of a first attempt. Another problem is that the yield for integrated circuits using an analog design approach may be compromised if there are inaccuracies in the tracking of the critical signals over temperature, voltage and process.

An object of the invention, therefore, is to provide fast detection of single and multiple hits within a content-addressable memory or other device having multiple sense outputs that must be resolved. Another object is to provide such detection in a design that is free from the risks associated with the analog design. Yet another object of the invention is to provide such detection in a digital design that is predictable, reliable and easy to implement.

SUMMARY OF THE INVENTION

The invention includes a novel hit detector that detects and distinguishes between single and multiple hits within a device having multiple sense outputs. An example of such a device is a content-addressable memory (CAM) which has sense lines connected to its memory locations for indicating a hit at a CAM address. When used with a CAM, the hit detector includes a first group of individual detectors divided into subgroups, each individual detector within a subgroup is associated with a separate sense line of the CAM but sharing a common detect line with other detectors within the subgroup. The detect line indicates a hit if one or more detectors within the subgroup detects a hit from an associated sense line. The hit detector also includes a second group similar in design to the first group and also associated with the sense lines of the CAM. However, the sense lines are associated with the individual detectors of the two groups in such a way that no subgroup of the first group has more than one sense line in common with a subgroup of the second group. With such an arrangement, the number of detect lines indicating a hit is greater than one in at least one of the groups.

The hit detector may further include additional circuitry for resolving outputs from the detect lines of the two groups to determine the number of hits. If the CAM or other multiple sense output device is relatively large and has a significant number of sense lines, this circuit may include additional groups of individual detectors that receive as associated inputs the detect line outputs from the first two groups. These additional groups include secondary detect lines that indicate a hit if one or more detectors within an additional group detects a hit from an associated detect line output. This process can be repeated using additional groups of detectors to further reduce the number of detect line outputs. The circuit also includes digital logic for determining from the final group outputs, whether the number of hits is zero, one, or more than one.

The individual detectors may comprise transistors, preferably field effect transistors each having a gate, drain and source. Each detector of a subgroup has one of its source or drain connected to the shared detect line, the other of its source or drain connected to a ground line, and its gate connected to a sense line.

The invention also includes a novel method for detecting and distinguishing between single and multiple hits. In the context of a CAM, each of the CAM's sense lines is associated with detectors of first and second groups. The detectors within each group are divided into subgroups that share a common detect line which then indicates if one or more detectors within the subgroup detects a hit from an associated sense line. In case of a multiple hit, the number of detect line outputs indicating a hit is greater than one in at least one of the groups since no subgroup of the first group has more than one sense line in common with a subgroup of the second group. For example, a multiple hit may be indicated by one active output in the first group and two active outputs in the second group, or two active outputs in both groups depending on where the hits occur and on the specific associations of sense lines with individual detectors.

The foregoing and other objects, features, and advantages of the invention will become more apparent from the following detailed description of a preferred embodiment which proceeds with reference to the accompanying drawings.

DETAILED DESCRIPTION OF A PREFERRED EMBODIMENT

Figure 1:
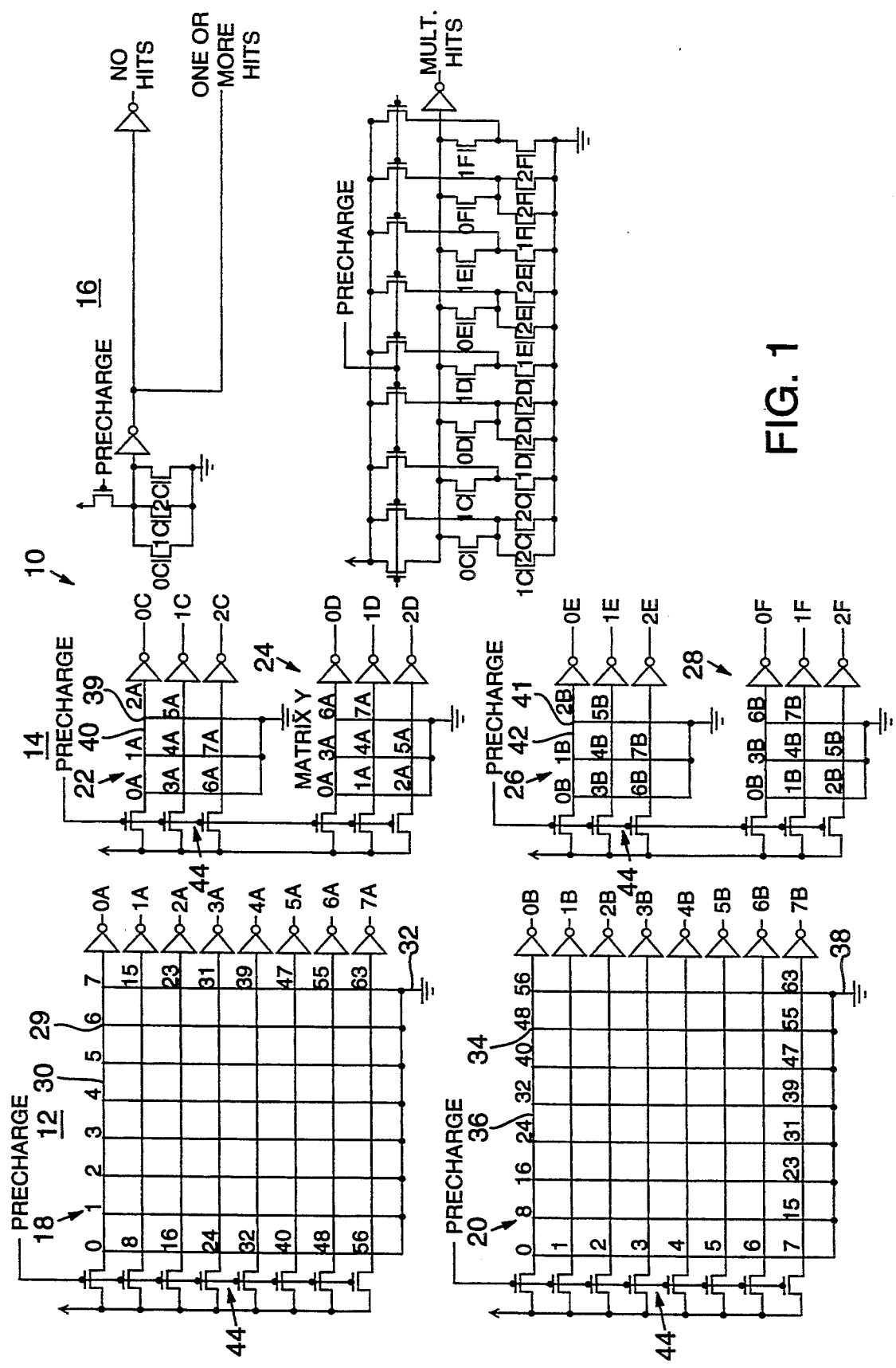
FIG. 1 is a functional diagram of a hit detector according to the invention, showing conceptually how such a detector is constructed for a 64-word CAM, for example.

FIG. 1 is a functional diagram of a hit detector 10 according to the invention for detecting and distinguishing between single and multiple hits within a CAM. The hit detector 10 is shown conceptually, and it should be understood that the illustrated hit detector can be implemented in a number of equivalent ways. The detector may also be implemented for CAMS of various sizes, such as for a 64-word CAM in FIG. 1. Therefore, the specific structural and functional details disclosed herein are not to be interpreted as limiting, but merely as a basis for understanding the claims and as a basis for teaching one skilled in the art how to practice the invention.

The hit detector 10 has three stages 12, 14 and 16. Larger detectors may have additional stages, as will be shown. The first stage 12 includes two groups of detectors 18 and 20, each shown as a matrix for ease of understanding. The first stage 12 is connected to the 64 sense lines (0 through 63) from the 64-word CAM to detect the occurrence of a hit on a single sense line or multiple hits on several sense lines. The second stage 14 includes third fourth, fifth and sixth groups of detectors 22, 24, 26 and 28 arranged as matrices for resolving the group outputs of the first stage 12. The third stage 16 includes combinational logic for resolving the group outputs of the second stage 14.

To accommodate the 64 sense lines, the first group 18 has 64 individual detectors 29, each shown as an intersection of a detect line 30 and a ground line 32. Each detector 29 is associated with a unique sense line 0 through 63, which are each in turn connected to a respective memory address within the CAM. As will be explained, a change in a sense line from inactive to active alerts an individual detector that a hit has occurred at the CAM memory address. Since there are 64 sense lines as inputs to the first group 18, the group must have 64 intersections. The individual detectors 29 are divided into subgroups, or rows, that share a common detect line with other detectors within the subgroup. With such an arrangement, the detect line indicates a hit if one or more detectors within its subgroup detects a hit from an associated sense line. Group 18 has eight detect lines producing detect line outputs 0A through 7A. The schematics of groups 18 and 20 in FIG. 1 are shown as square matrices. This optimizes the speed of the matrices by putting the same number of detectors (eight) within a subgroup in both the first group 18 and the second group 20. Other topologies such as a 16-by-4 matrix for the first group 18 and a 4-by-16 matrix for the second group 20 are, of course, possible. The physical association may be by a direct connection or may be indirect, as the particular implementation requires.

The second group 20 of detectors is similar in design to the first group 18, with the same 64 sense lines connected to the detectors. For clarity in this description, the individual detectors in group 20 are numbered 34, the detect lines are numbered 36 and the ground lines are numbered 38. Group 20 has eight detect line outputs numbered 0B through 7B. The difference between the first group 18 and the second group 20 is the specific associations of sense lines and detectors. The sense lines are associated with the detectors of the two groups 18 and 20 in such a way that no subgroup of the first group 18 has more than one sense line in common with a subgroup of the second group 20. In the first group 18, for example, the sense lines progress in number left to right across each row of the matrix, starting with the top row and proceeding to the bottom. In the second group 20, the sense lines progress in number top to bottom down each column, starting with the leftmost column and proceeding to the right.

Figure 2:
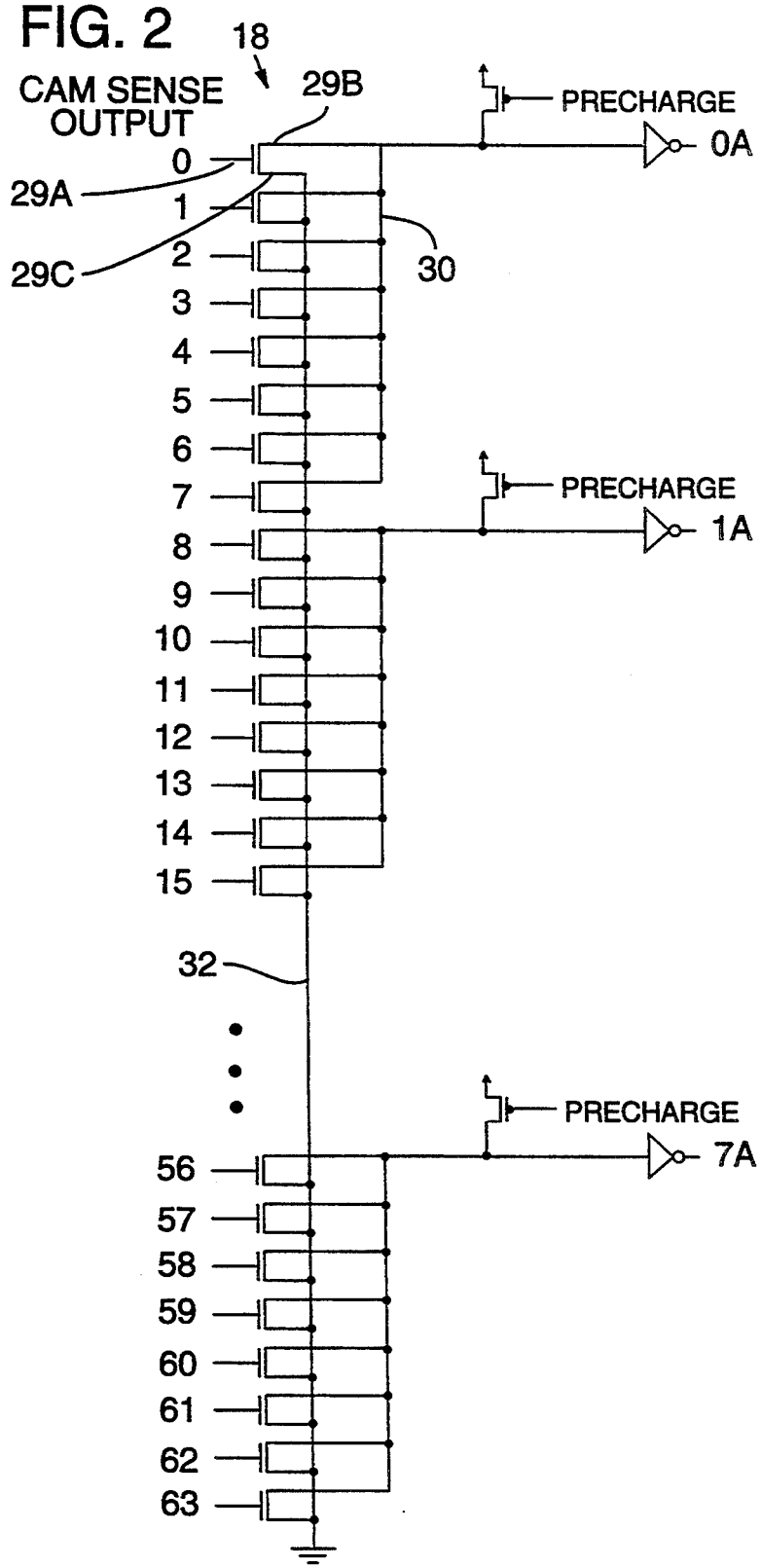
FIG. 2 is a schematic diagram of a preferred implementation of a first group of detectors in FIG. 1.
Figure 3:
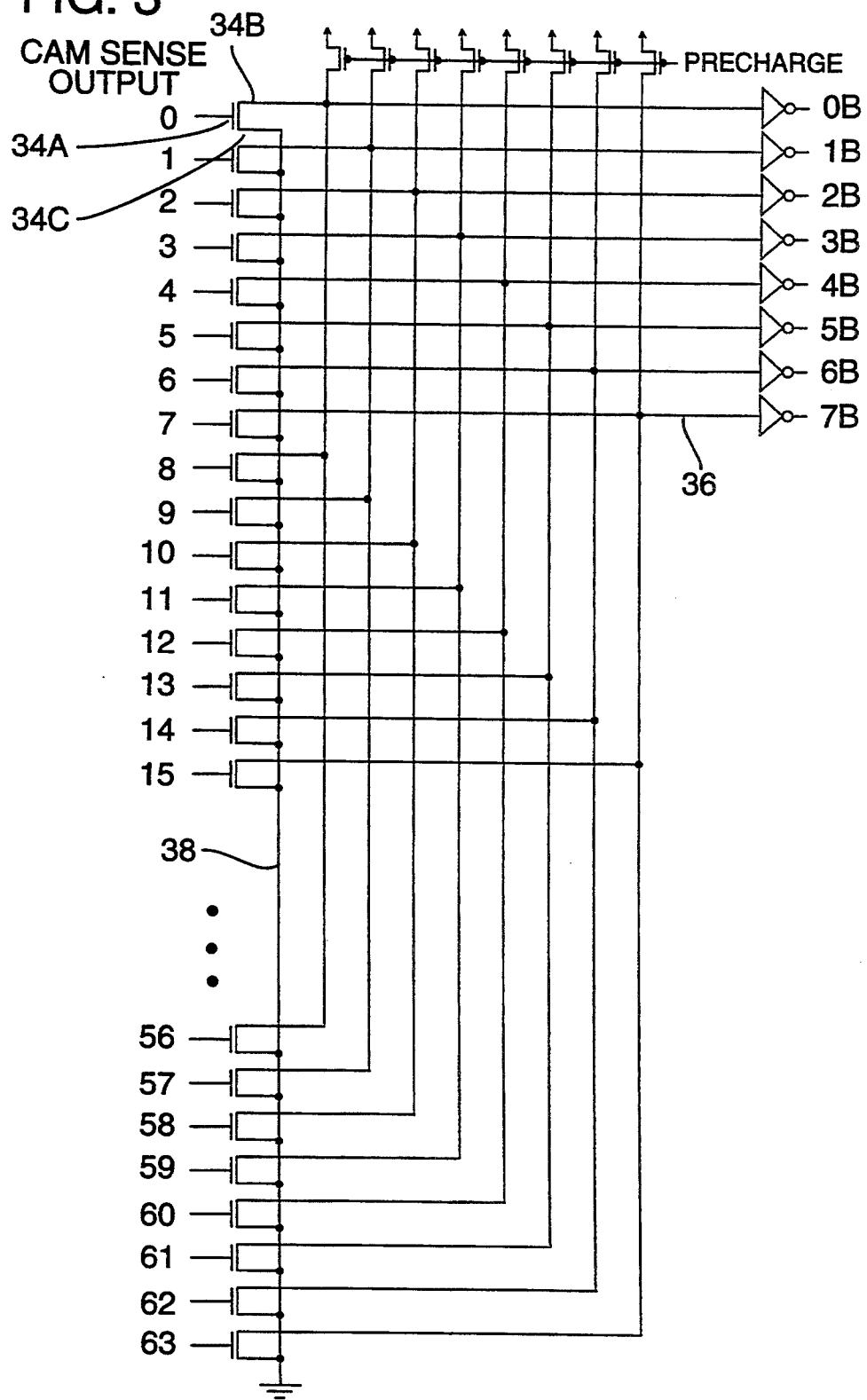
FIG. 3 is a schematic diagram of a preferred implementation of a second group, or matrix, of detectors in FIG. 1.

In the present embodiment, the detectors 29 and 34 are preferably N-type field effect transistors. FIG. 2 shows a preferred layout of group 18, which is designed to pitch match the CAM. Each transistor in the group 18 has its gate 29a connected to the associated sense line, its drain 29b connected to a detect line 30, and its source 29c connected to a ground line 32. However, it should be understood that other types of transistors such as P-type field effect transistors, bipolar transistors, etc., can be used as well. FIG. 3 shows a preferred layout of group 20, which is designed to pitch match the CAM. Each detect transistor 34 in group 20 has its gate 34a connected to the associated sense line, its drain 34b connected to the appropriate detect line 36 and its source 34c connected to the ground line 38. Other layouts are, of course, possible.

The detector group 22 of the second stage 14 is also similar in design to the group 18, with the following differences. The input to each detector 39 in the group 22 is a detect line output 0A through 7A from the first group 18. Since there are eight detect line outputs from the first group 18, the matrix of the third group must be large enough for eight individual detector locations (intersections). A 3-by-3 matrix is used, with one detector location left empty. The third group is also divided into subgroups, with each detector associated with a separate detect line output 0A through 7A from the first group 18. The detectors 39 within a subgroup share a secondary detect line 40 with other detectors within the subgroup. This secondary detect line 40 indicates a hit if one or more detectors within the subgroup detects a hit from an associated detect line output. As in the first group, the association may be a direct connection or an indirect connection as the implementation requires. The detectors 39 are also preferably N-type field effect transistors. The secondary detect lines 40 produce detect line outputs 0C through 2C.

The fourth group 24 is similar in design to the third group 22, except for the specific associations of the detect line outputs from the first group 18. As in the relationship between the first and second groups 18 and 20, no subgroup of group 22 has more than one detect line output in common with a subgroup of group 24. The detect line outputs of group 24 are number 0D through 2D.

The fifth and sixth groups 26 and 28 are connected to the outputs 0B through 7B of the second group 20. Each group is laid out as a 3-by-3 matrix to provide sufficient intersections for these eight detect line outputs from group 20. The groups 26 and 28 are similar in design to the other groups, with detectors divided into subgroups sharing a common detect line and each detector within a group associated with a separate detect line output from group 20. Again, the secondary detect line indicates a hit if one or more detectors with the subgroup detects a hit from an associated detect line output. As in the other pairs of groups, the detect line outputs are associated with the detectors of the fifth and sixth group in such a way that no subgroup of the fifth group 26 has more than one detect line output in common with a subgroup of the sixth group 28. The detect line outputs of groups 26 and 28 are numbered 0E through 2E and 0F through 2F, respectively.

The third stage 16 receives the outputs of the secondary detect lines from the second stage 14 (the third through sixth detector groups) and generates three signals indicating whether the number of hits is zero, one or more, or more than one.

The detect line outputs of groups 22 through 28 connect to the gates of transistors within the third stage as shown in FIG. 1. The logic of the third stage 16 is structured to produce the following Boolean logic equations:

$$\text{multiple hits} = \quad (1)$$
$$0c(1c + 2c) + 1c2c + 0d(1d + 2d) + 1d2d +$$
$$0e(1e + 2e) + 1e2e + 0f(1f + 2f) + 1f2f$$

$$\text{one or more hits} = 0C + 1C + 2C \quad (2)$$

$$\text{no hits} = \overline{\text{one or more hits}} \quad (3)$$

The "one or more" hits output can be used as the "one hit" output since in most applications the state of the "one hit" output is ignored if the "multiple" hits output is active. If a true "one hit" output is needed, the "one or more" hits output can be gated by the "multiple hits" output.

In operation, the detect lines and secondary detect lines in the six groups are initially precharged to a high voltage. In the present embodiment this precharging is accomplished by applying a precharge signal to the precharge transistors 44 attached to each detect line in groups 18 through 28. After the precharge signal is removed, the detect lines remain charged until a hit is detected by a detector connected to such a line.

The hit detector 10 distinguishes among zero, one or more than one hits by the number of detect lines in groups 18 and 20 which are discharged in response to an interrogation of the CAM. If zero hits occur within the CAM, there are no sense lines active, and no detect lines are discharged in either group 18 or 20. If a single hit occurs within the CAM, the corresponding sense line remains active and the hit is detected in both the first and second groups 18 and 20. For example, if sense line 7 is active, it causes the associated detect transistors to discharge their respective detect lines, causing detect line output 0A from group 18 and detect line output 7B from group 20 to become active. If a multiple hit occurs (more than one CAM sense line active), an additional detect line output is activated by at least one of the groups 18 and 20. For example, if sense lines 0 and 4 are both active, detect line output 0A from group 18 and detect line outputs 0B and 4B from group 20 become active. That at least two detect lines in one of the groups are discharged is always assured because of the pattern of association of the sense lines with the detectors in groups 18 and 20. Thus, a multiple hit that is missed by group 18 is detected by group 20, and a multiple hit that is missed by group 20 is detected by group 18.

This process is then repeated in the second stage 14. The detect line outputs 0A through 7A of group 18 are used as the associated inputs to the detect transistors in groups 22 and 24. Likewise, the detect line outputs 0B through 7B of group 20 are used as the associated inputs to the detect transistors in groups 26 and 28. A single hit within the CAM, therefore, causes a detect line to discharge in groups 18 and 20 and a secondary detect line to discharge in groups 22 through 28. A multiple hit detected by the first group 18 causes multiple detect lines to discharge in either the third or fourth groups 22 or 24. Similarly, a multiple hit detected by the second group 20 causes multiple detect lines to discharge in either the fifth or sixth groups 26 or 28.

The third stage 16 is combinational logic for interpreting the output of the secondary detect lines from the second stage 14 in accordance with equations (1) through (3) above.

The invention as embodied in FIG. 1 may alternatively be thought of as having two portions. The first portion includes at least two groups of detectors, such as groups 18 and 20, each associated with the sense lines of a content-addressable memory. The sense lines are associated with the detectors within each group in such a way that a multiple hit causes at least one of the groups to indicate a hit on more that one of its group outputs. Additional groups such as the third through sixth groups may be included in the first portion if the number of sense lines is large. The second portion includes combinational logic for determining from the group outputs of the first portion whether the number of hits is zero, one, or more than one.

Figure 4:
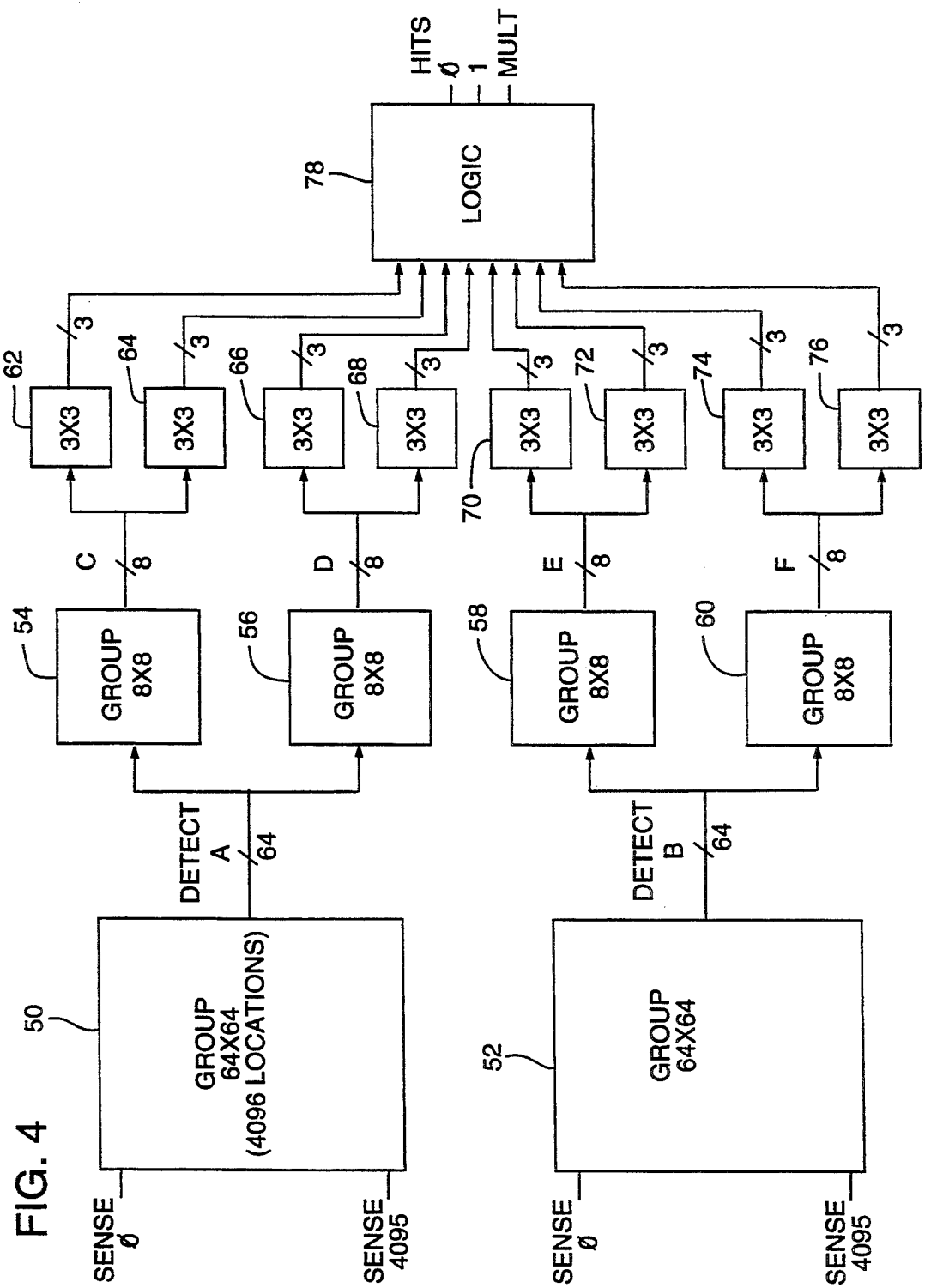
FIG. 4 is a block diagram of the hit detector constructed for use with a 4096-word CAM.

This hit detect concept can be scaled to any size needed by adjusting the size and number of groups used. For example, a hit detector 10 for a 4096-word CAM, shown in FIG. 4, may have four stages. The first stage includes two groups 50 and 52 each being 64-by-64. The second stage includes four 8-by-8 groups 54 through 60. The third stage includes eight 3-by-3 groups 62 through 76. The final stage 78 is combinational logic for resolving results from the third stage.

Figure 5:
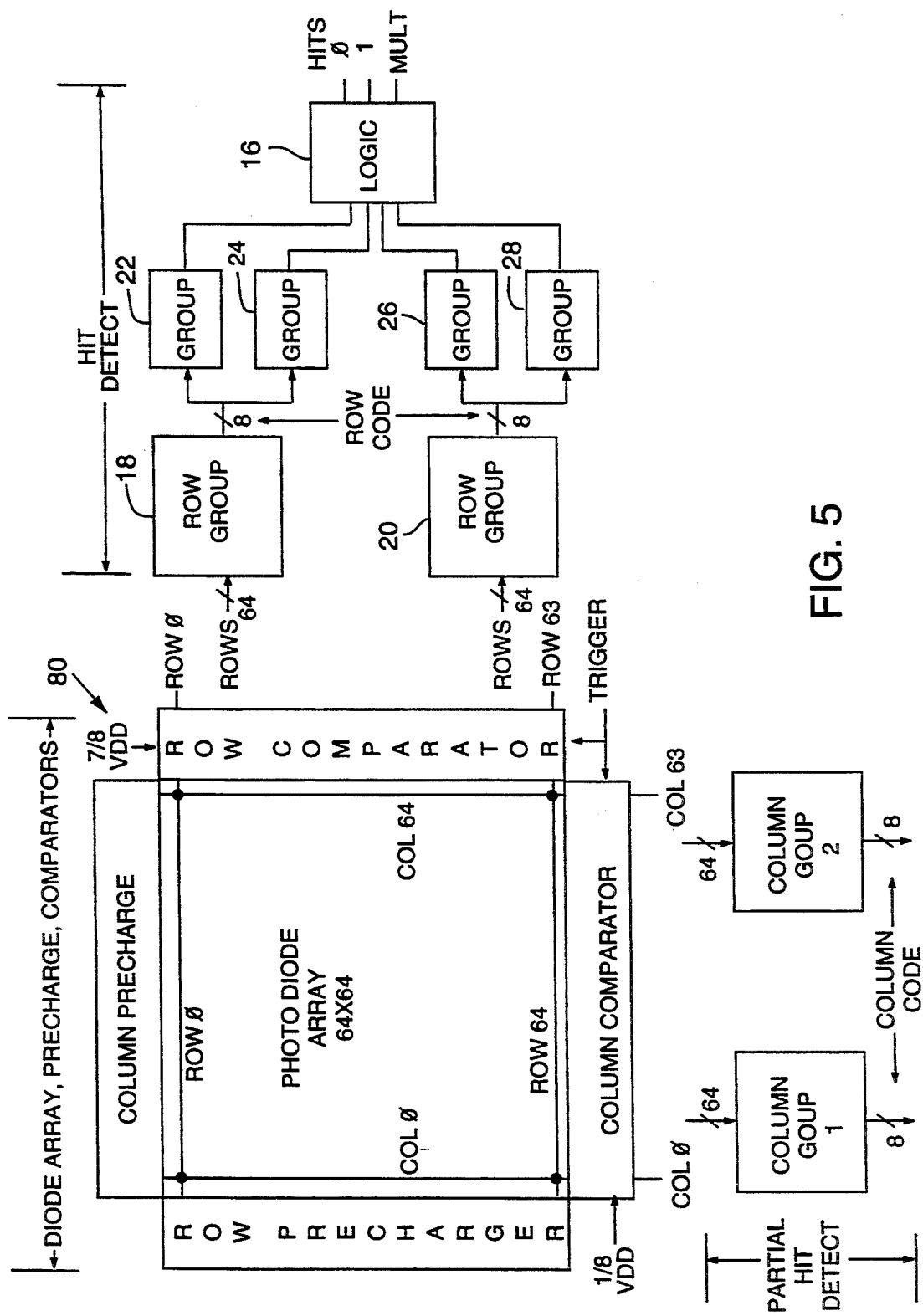
FIG. 5 is a block diagram of a hit detector according to the invention showing how such a detector is used with another device having multiple sense outputs.

Although the hit detector 10 is described herein within the context of detecting hits within a CAM, it is not limited to this application. It maybe used with any device that generates multiple sense outputs. An example of another application is with a photodiode detector array 80 shown in FIG. 5. The array 80 comprises 4096 photodiodes arranged in a 64-by-64 array, one diode at the intersection of each horizontal and vertical detect line. The objective is to detect the occurrence of a stimulus, such as a beam of light, striking a photodiode and determine the location of the photodiode that was struck. It is assumed that in normal operation the beam of light will strike only one photodiode. Initially all horizontal detect lines are precharged high and all vertical detect lines are precharged low in array 80. After initialization the photodiode array 80 is exposed to the beam of light. Any diode which the light beam strikes turns on and shorts its horizontal and vertical detect lines, causing the horizontal detect to drop below the precharge voltage and the vertical detect to rise above the precharge voltage. After a set period the detect lines are sampled by a comparator, with the horizontal detect lines being compared to a row reference voltage and the vertical detect lines being compared to a column reference voltage. The output of the comparators are sense lines that are active indicating the row and column of the diode which was activated. The 64 horizontal outputs are then connected to the hit detector 10. In addition to indicating zero, one or multiple hits the detect line outputs of the first two groups 18 and 20 of the hit detector can be used as two byte code to indicate which row the hit occurred in. Likewise, structures similar to the first two groups 18 and 20 of the hit detector may be attached to the vertical outputs of the photodiode array and can be used to create a two byte code which indicates in which column the hit occurred. These codes may not be meaningful for a multiple hit.

Having illustrated and described the principles of the invention in preferred embodiments, it should be apparent to those skilled in the art that the invention can be modified in arrangement and detail without departing from such principles. For example, the second stage comprising groups 22 through 28 could be replaced with additional combination logic, but at a cost of speed. And the N-type field effect transistors could be replaced with other transistor or equivalent electronic detection devices. Features of the invention shown in hardware may also be implemented in software.

Therefore, the illustrated embodiment should be considered only an example of the invention and not a limitation on the scope of the claims. I therefore claim as my invention all modifications and equivalents to the illustrated embodiment coming within the scope and spirit of the following claims.

I claim:

1. Apparatus for detecting and distinguishing between single and multiple hits within a device having multiple sense outputs, comprising:

a first group of detectors for detecting sense outputs of a multiple sense output device, the detectors divided into subgroups, each detector within a subgroup associated with a sense output of the device and sharing a detect line with other detectors within the subgroup, the detect line indicating a hit if one or more detectors within the subgroup detects a hit from an associated sense output; and a second group of detectors for detecting sense outputs of a multiple sense output device, the detectors divided into subgroups, each detector within a subgroup associated with a sense output of the device and sharing a detect line with other detectors within the subgroup, the detect line indicating a hit if one or more detectors within the subgroup detects a hit from an associated sense output, the sense outputs being associated with the detectors of the two groups in such a way that no subgroup of the first group has more than one sense output in common with a subgroup of the second group.

2. The apparatus of claim 1 wherein the sense outputs associated with detectors in the first group and the sense outputs associated with the detectors in the second group are the same sense outputs.

3. The apparatus of claim 1 including a circuit for resolving outputs from the detect lines of the first and second groups of detectors to determine the number of hits.

4. The apparatus of claim 3 wherein the circuit is constructed to determine whether the number of hits is zero, one, or more than one.

5. The apparatus of claim 1 wherein the sense outputs are associated with the detectors of the first and second groups in such a manner to ensure that a multiple hit within the device causes more than one detect line to indicate a hit in at least one of the groups.

6. The apparatus of claim 1 including:
- a third group of detectors divided into subgroups, each detector within a subgroup of the third group associated with a detect line output from the first group and sharing a secondary detect line with other detectors within the subgroup of the third group, the secondary detect line indicating a hit if one or more detectors within the subgroup of the third group detects a hit from an associated detect line output;
- a fourth group of detectors divided into subgroups, each detector within a subgroup of the fourth group associated with a detect line output from the first group and sharing a secondary detect line with other detectors within the subgroup of the fourth group, the secondary detect line indicating a hit if one or more detectors within the subgroup of the fourth group detects a hit from an associated detect line output;
- a fifth group of detectors divided into subgroups, each detector within a subgroup of the fifth group associated with a detect line output from the second group and sharing a secondary detect line with other detectors within the subgroup of the fifth group, the secondary detect line indicating a hit if one or more detectors within the subgroup of the fifth group detects a hit from an associated detect line output;
- a sixth group of detectors divided into subgroups, each detector within a subgroup of the sixth group associated with a detect line output from the second group and sharing a secondary detect line with other detectors within the subgroup of the sixth group, the secondary detect line indicating a hit if one or more detectors within the subgroup of the sixth group detects a hit from an associated detect line output,
- the detect line outputs being associated with the detectors of the third, fourth, fifth and sixth groups in such a way that no subgroup of the third group has more than one detect line output in common with a subgroup of the fourth group and no subgroup of the fifth group has more than one detect line output in common with a subgroup of the sixth group; and circuitry connected to outputs of the third, fourth, fifth and sixth detector groups for determining the number of hits within the device.

7. The apparatus of claim 1 wherein a detector comprises a transistor.

8. The apparatus of claim 1 wherein the detectors comprise field effect transistors each having a gate, drain and source, each detector of a subgroup having one of its source or drain connected to the shared detect line, the other of its source or drain connected to a ground line, and its gate connected to a sense line output from the device having multiple sense outputs.

9. The apparatus of claim 1 including a circuit for initializing the detect lines of the groups before detecting hits.

10. The apparatus of claim 1 wherein the device is a content-addressable memory and the sense outputs are sense lines connected to memory locations for indicating a hit at a memory location.

11. The apparatus of claim 1 wherein the device is a detector array.

12. The apparatus of claim 1 wherein each of the subgroups of the first group has substantially an equal number of detectors.

13. Apparatus for detecting and distinguishing between single and multiple hits within a content-addressable memory having sense line outputs connected to its memory locations for indicating a hit at a memory address, comprising:
- a first group of detectors divided into subgroups, each detector within a subgroup associated with a sense line of the content-addressable memory and sharing a detect line with other detectors within the subgroup, the detect line indicating a hit if one or more detectors within the subgroup detects a hit from an associated sense line; and
- a second group of detectors divided into subgroups, each detector within a subgroup associated with a sense line of the content-addressable memory and sharing a detect line with other detectors within the subgroup, the detect line indicating a hit if one or more detectors within the subgroup detects a hit from an associated sense line,
- the sense line outputs being associated with the detectors of the two groups in such a way that multiple hits within the content-addressable memory cause at least one of the two groups to indicate a hit on more than one detect line.

14. The apparatus of claim 13 wherein the sense line outputs are associated with the detectors of the two groups so that no subgroup of the first group has more than one sense line output in common with a subgroup of the second group.

15. The apparatus of claim 13 including means for precharging the detect lines.

16. The apparatus of claim 13 including combinational logic for resolving the detect line outputs from the first and second groups to determine the number of hits.

17. The apparatus of claim 16 wherein the combinational logic is constructed to determine whether the number of hits is zero, one, or more than one.

18. A method for detecting and distinguishing between single and multiple hits within a device having multiple sense outputs, comprising:
providing a first group of individual detectors divided into subgroups, each detector within a subgroup associated with a sense output and sharing a detect line with other detectors within the subgroup, the detect line indicating a hit if one or more detectors within the subgroup detects a hit;

providing a second group of individual detectors divided into subgroups, each detector within a subgroup associated with a sense output and sharing a detect line with other detectors within the subgroup, the detect line indicating a hit if one or more detectors within the subgroup detects a hit;

arranging each of the sense outputs with the detectors in the first and second groups in such a way that multiple hits within the device cause at least one of the two groups to indicate a hit on more than one detect line within a group.

19. The method of claim 18 wherein the first and second groups indicate a hit on a detect line by a detect line output, and the method includes determining from detect line outputs whether the number of hits is zero, one, or more than one.

20. The method of claim 18 wherein the arranging step comprises associating the detectors of the two groups with the sense outputs in such a way that no subgroup of the first group has more than one sense output in common with a subgroup of the second group.

* * * * *

UNITED STATES PATENT AND TRADEMARK OFFICE
CERTIFICATE OF CORRECTION

PATENT NO. : 5,426,602
DATED : June 20, 1995
INVENTOR(S) : Arthur G. Lukoff

It is certified that error appears in the above-indentified patent and that said Letters Patent is hereby corrected as shown below:

At column 1 line 14 change "to-make" to --to make--.

At column 1 line 25 change "know" to --known--.

At column 4 line 59 change "third fourth" to -- third, fourth--.

Signed and Sealed this

Sixteenth Day of July, 1996

Attest:

BRUCE LEHMAN

Attesting Officer *Commissioner of Patents and Trademarks*